US012364138B2

(12) United States Patent
Chen et al.

(10) Patent No.: US 12,364,138 B2
(45) Date of Patent: Jul. 15, 2025

(54) DISPLAY PANEL, MANUFACTURING METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Peng Chen, Beijing (CN); Kuo Sun, Beijing (CN); Ziru Zhao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 495 days.

(21) Appl. No.: 17/789,390

(22) PCT Filed: Aug. 4, 2021

(86) PCT No.: PCT/CN2021/110670
§ 371 (c)(1),
(2) Date: Jun. 27, 2022

(87) PCT Pub. No.: WO2022/052686
PCT Pub. Date: Mar. 17, 2022

(65) Prior Publication Data
US 2023/0031404 A1 Feb. 2, 2023

(30) Foreign Application Priority Data

Sep. 14, 2020 (CN) .......................... 202010962620.9

(51) Int. Cl.
*H10K 59/38* (2023.01)
*G06V 40/13* (2022.01)
(Continued)

(52) U.S. Cl.
CPC ......... *H10K 59/38* (2023.02); *G06V 40/1318* (2022.01); *H10K 50/84* (2023.02);
(Continued)

(58) Field of Classification Search
CPC .. G06V 40/1318; H10K 59/60; H10K 59/123; H10K 59/38; H10K 59/40;
(Continued)

(56) References Cited

U.S. PATENT DOCUMENTS

2012/0169962 A1* 7/2012 Yuki ....................... G06F 3/042
445/25
2018/0033835 A1 2/2018 Zeng et al.
(Continued)

FOREIGN PATENT DOCUMENTS

CN 108288681 A 7/2018
CN 109244116 A 1/2019
(Continued)

OTHER PUBLICATIONS

CN 202010962620.9 First Office Action issued on Nov. 11, 2024.

*Primary Examiner* — Marlon T Fletcher
*Assistant Examiner* — Christina A Sylvia
(74) *Attorney, Agent, or Firm* — IPro, PLLC

(57) ABSTRACT

A display panel, a manufacturing method therefor, and a display device. The display panel comprising: a base substrate; a plurality of light emitting devices on the base substrate; an encapsulation layer on a side of the light emitting devices away from the base substrate, configured for encapsulating the plurality of light emitting devices; a photosensitive sensor on a side of the light emitting devices away from the encapsulation layer; a color film layer on a side of the encapsulation layer away from the base substrate, comprising a plurality of color film elements; and a light-shielding layer on a side of the encapsulation layer away
(Continued)

from the base substrate, comprising a plurality of first openings and a plurality of second openings, the second openings each being filled with a filter element, and the second openings each being used for transmitting light reflected by a finger toward the photosensitive sensor.

18 Claims, 4 Drawing Sheets

(51) Int. Cl.
  *H10K 50/84*  (2023.01)
  *H10K 50/86*  (2023.01)
  *H10K 59/123*  (2023.01)
  *H10K 59/40*  (2023.01)
  *H10K 59/60*  (2023.01)
  *H10K 59/80*  (2023.01)
  *H10K 71/00*  (2023.01)
  *H10K 59/12*  (2023.01)
  *H10K 59/65*  (2023.01)
(52) U.S. Cl.
  CPC ......... *H10K 50/865* (2023.02); *H10K 59/123* (2023.02); *H10K 59/40* (2023.02); *H10K 59/60* (2023.02); *H10K 59/8792* (2023.02); *H10K 71/00* (2023.02); *H10K 59/1201* (2023.02); *H10K 59/65* (2023.02); *H10K 59/8731* (2023.02)

(58) Field of Classification Search
  CPC ........... H10K 59/1201; H10K 59/8731; H10K 59/121; H10K 59/8792; H10K 59/65; H10K 50/84; H10K 50/865; H10K 71/00; H01L 21/77
  See application file for complete search history.

(56) References Cited

U.S. PATENT DOCUMENTS

2021/0376003 A1* 12/2021 Xu .................. H10K 50/865
2021/0397806 A1* 12/2021 Lu .................. G06V 10/143

FOREIGN PATENT DOCUMENTS

| CN | 110276312 A | 9/2019 |
| CN | 110970480 A | 4/2020 |
| CN | 111312792 A | 6/2020 |
| CN | 111477635 A | 7/2020 |
| CN | 111507229 A | 8/2020 |
| CN | 111599846 A | 8/2020 |

* cited by examiner

DISPLAY PANEL, MANUFACTURING METHOD THEREFOR, AND DISPLAY DEVICE

CROSS REFERENCE TO RELATED APPLICATION

The present application is a National Stage of International Application No. PCT/CN2021/110670, filed on Aug. 4, 2021, which claims the priority to Chinese Patent Application No. 202010962620.9, filed to the China National Intellectual Property Administration on Sep. 14, 2020, both of which are incorporated in their entirety herein by reference.

FIELD

The disclosure relates to the field of display technology, in particular to a display panel, a manufacturing method therefor, and a display device.

BACKGROUND

As a display technology rapidly advances, an organic light-emitting diode (OLED) is required to be more striking in appearance except for its traditional role in information display, and has been developing towards a higher screen-to-body ratio, so an under-screen fingerprint identification technology is highly popular with consumers.

However, as for a display with an under-screen fingerprint identification function, the transmittance needs to reach more than 2.5%, to meet requirements of mass production, which results in a higher screen reflectivity and influences a display effect.

SUMMARY

A display panel provided in the disclosure includes: a substrate; a plurality of light emitting devices on the substrate; an encapsulation layer on a side of the light emitting devices away from the substrate, configured for encapsulating the plurality of light emitting devices; a photosensitive sensor on a side of the light emitting devices away from the encapsulation layer; a color film layer on a side of the encapsulation layer away from the substrate, including a plurality of color film elements, wherein orthographic projections of the color film elements on the substrate are provided with an overlapping region with orthographic projections of the light emitting devices on the substrate; and a light-shielding layer on a side of the encapsulation layer away from the substrate, including a plurality of first openings and a plurality of second openings, wherein orthographic projections of the first openings on the substrate are provided with an overlapping region with the orthographic projections of the color film elements on the substrate, the second openings each are filled with a filter element, and the second openings each are used for transmitting light reflected by a finger to the photosensitive sensor, such that the light reflected by the finger is imaged at the position of the photosensitive sensor.

Optionally, in the embodiment of the disclosure, the color film layer includes color film elements of at least three colors; wherein the color film elements of different colors transmits light rays of different colors, and a material of the filter element is the same as a material of at least one color film element of at least one color.

Optionally, in the embodiment of the disclosure, the plurality of color film elements include a green color film element transmitting a green light ray; and the material of the filter element is the same as a material of the green color film element.

Optionally, in the embodiment of the disclosure, the photosensitive sensor is on a side of the substrate away from the light emitting devices.

Optionally, in the embodiment of the disclosure, each of the light emitting devices includes: a first electrode, a second electrode on a side of the first electrode away from the substrate, and a light emitting layer between the first electrode and the second electrode; the display panel further includes a light blocking layer between the substrate and the light emitting layer; and the light blocking layer includes a plurality of third openings, and orthographic projections of the third openings on the substrate are provided with an overlapping region with orthographic projections of the second openings on the substrate.

Optionally, in the embodiment of the disclosure, the display panel further includes: a pixel defining layer; wherein the pixel defining layer is configured to define a region of the light emitting device; the pixel defining layer includes an opaque material, and the pixel defining layer is multiplexed as the light blocking layer; and the pixel defining layer further includes a plurality of fourth openings, and orthographic projections of the fourth openings on the substrate are provided with an overlapping region with orthographic projections of the first electrodes on the substrate.

Optionally, in the embodiment of the disclosure, the pixel defining layer is made of black photosensitive organic.

Optionally, in the embodiment of the disclosure, the display panel further includes: a first conductive layer between the substrate and the light emitting devices, a second conductive layer between the substrate and the first conductive layer, and a third conductive layer between the first conductive layer and the second conductive layer; wherein the first conductive layer includes a plurality of fifth openings, and orthographic projections of the fifth openings on the substrate are provided with an overlapping region with the orthographic projections of the second openings on the substrate; an orthographic projection of a pattern of the second conductive layer on the substrate does not overlap the orthographic projections of the second openings on the substrate; and an orthographic projection of a pattern of the third conductive layer on the substrate does not overlap the orthographic projections of the second openings on the substrate.

Optionally, in the embodiment of the disclosure, the display panel further includes: a thin film transistor, wherein the first conductive layer includes a conductive connection portion; and an input end of the thin film transistor is electrically connected to the first electrode through the conductive connection portion.

Optionally, in the embodiment of the disclosure, the display panel further includes: a touch detection layer between the encapsulation layer and the color film layer.

Optionally, in the embodiment of the disclosure, a size of an aperture of each of the third openings is smaller than a size of an aperture of each of the second openings.

Optionally, in the embodiment of the disclosure, the size of the aperture of each of the third openings ranges from 5 µm to 6 µm, and the size of the aperture of each of the second openings ranges from 6 µm to 8 µm.

Optionally, in the embodiment of the disclosure, orthographic projections of the plurality of second openings on the substrate are in an orthographic projection of the photosensitive sensor on the substrate.

Correspondingly, an embodiment of the disclosure further provides a display device. The display device includes the above display panel.

Correspondingly, an embodiment of the disclosure further provides a manufacturing method for the above display panel. The manufacturing method includes: forming the plurality of light emitting devices on the substrate; forming the encapsulation layer on the plurality of light emitting devices to encapsulate the plurality of light emitting devices; forming the color film layer on the encapsulation layer, and patterning the color film layer to obtain the plurality of color film elements; forming the light-shielding layer on the encapsulation layer, and patterning the light-shielding layer to obtain the plurality of first openings and the plurality of second openings; filling each of the second openings with a filter element; and attaching the photosensitive sensor to a side of the substrate away from the light emitting devices.

DETAILED DESCRIPTION OF THE EMBODIMENTS

The embodiments of the disclosure provide a display panel, a manufacturing method therefor, and a display device, for solving the problem that screen reflectivity of a display is high in the prior art.

Specific implementation modes of the display panel, the manufacturing method therefor, and the display device provided in the embodiments of the disclosure are described in detail below in combination with accompanying drawings. Thicknesses and shapes of film layers in the accompanying drawings do not reflect true scale, and are merely illustrative of the disclosure.

Figure 1:
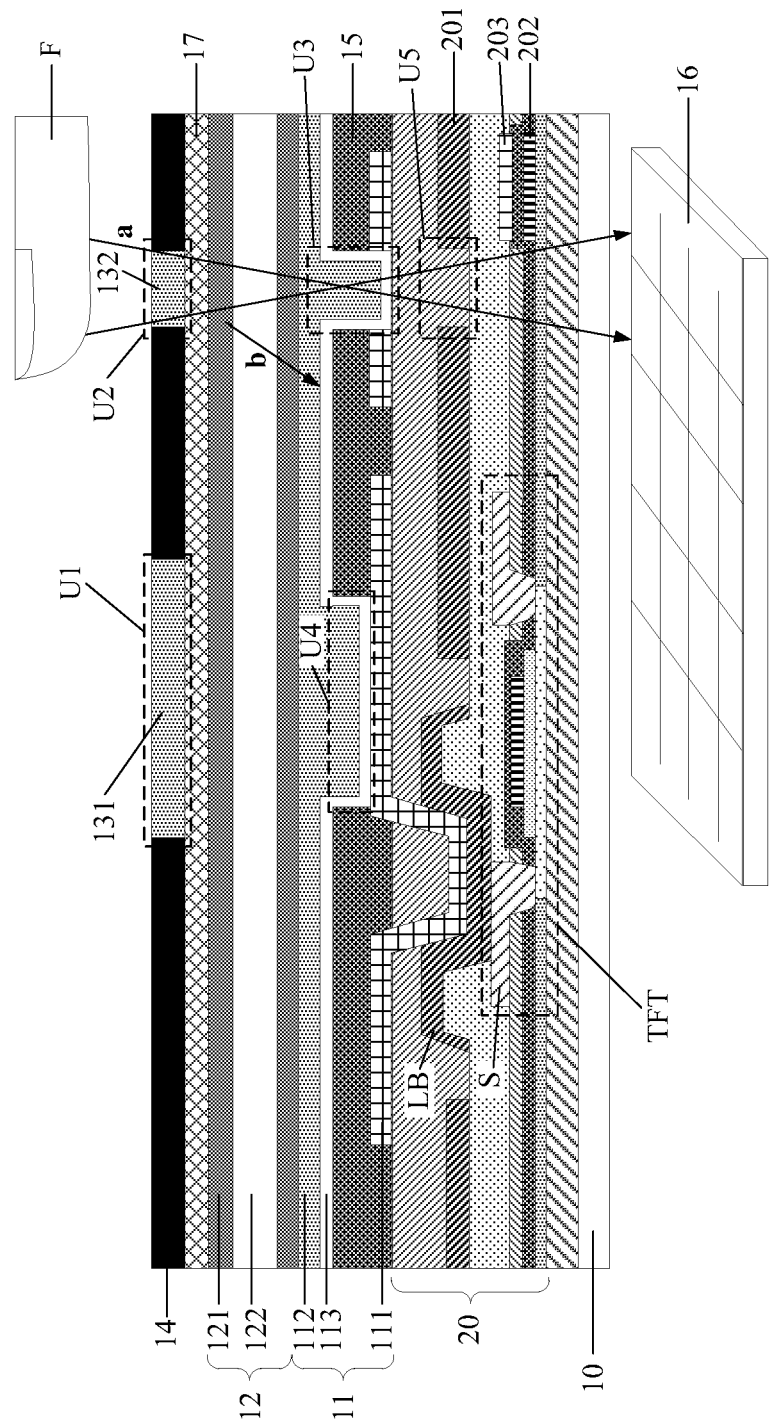
FIG. 1 is a first schematic diagram of a sectional structure of a display panel provided in an embodiment of the disclosure.

The embodiments of the disclosure provide a display panel. As shown in FIG. 1, the display panel includes: a substrate 10; a plurality of light emitting devices 11 on the substrate 10; an encapsulation layer 12d on a side of the light emitting devices 11 away from the substrate 10, configured for encapsulating the plurality of light emitting devices 11; a photosensitive sensor 16 on a side of the light emitting devices 11 away from the encapsulation layer 12; a color film layer on a side of the encapsulation layer 12 away from the substrate 10; and a light-shielding layer 14 on a side of the encapsulation layer 12 away from the substrate 10.

The color film layer includes a plurality of color film elements 131. Orthographic projections of the color film elements 131 on the substrate 10 are provided an overlapping region with orthographic projections of the light emitting devices 11 on the substrate 10. For example, the plurality of color film elements in the color film layer is arranged to correspond to the light emitting devices 11, respectively.

The light-shielding layer 14 includes a plurality of first openings U1 and a plurality of second openings U2. Orthographic projections of the first openings U1 on the substrate 10 are provided with an overlapping region with the orthographic projections of the color film elements 131 on the substrate 10. For example, the plurality of first openings U1 is arranged to correspond to the color film elements 131, respectively, the second openings U2 each are filled with a filter element 132, and the second openings U2 each are used for transmitting light reflected by a finger F to the photosensitive sensor 16, such that the light reflected by the finger F is imaged at the position of the photosensitive sensor 16.

According to the display panel provided in the embodiment of the disclosure, a plurality of second openings are provided in the light-shielding layer, the second openings may be used as imaging pinholes for fingerprint identification, then the light reflected by the finger is transmitted to the photosensitive sensor, and the light reflected by the finger is imaged at the position of the photosensitive sensor, so as to achieve a fingerprint identification function. The second openings serving as imaging pinholes are provided in the light-shielding layer, fingerprint identification is achieved in a pinhole imaging mode, and dense holes do not need to be arranged, such that a total area of the holes is reduced, and the reflectivity of the display panel is reduced. Moreover, the second openings each are filled with the filter element, such that part of the light may be filtered, so as to further reduce the reflectivity of the display panel.

Moreover, the color film layer and the light-shielding layer are arranged on a side of the encapsulation layer away from the substrate, and both the color film layer and the light-shielding layer have a light absorption effect, such that the color film layer and the light-shielding layer may be used for absorbing ambient light, so as to further reduce the reflectivity of the display panel.

The encapsulation layer 12 may encapsulate the light emitting devices 11 to prevent water vapor and oxygen from intruding into the display panel, such that the water vapor and oxygen are prevented from damaging the light emitting devices 11. Specifically, the encapsulation layer 12 may include an inorganic film layer 121 and an organic film layer 122 that are stacked with each other.

The color film layer includes a plurality of color film elements 131, the color film elements 131 correspond to the light emitting devices 11. Specifically, the color film layer may include color film elements 131 of at least three colors, for example, a red color film element, a green color film element and a blue color film element. One color film element may transmit a light ray of a color corresponding to the color film and filter out light rays of other colors, such that the display panel displays colors. Specifically, the color film elements 131 are mainly made of a photosensitive resin material, color film elements 131 of different colors may be obtained by dispersing pigments of different colors into photosensitive resin materials. In a manufacturing process, the photosensitive resin material containing the pigment may be coated on the encapsulation layer and then is subject to exposure, development and other processes to obtain the color film elements of one color. Exposure, development and other processes are performed repeatedly to obtain the color film elements 131 of at least three colors. During specific implementation, the color film elements may also be made of other photosensitive organic matter, for example, the color film elements may be made of polyimide materials, which is not limited herein.

The light-shielding layer 14 includes a plurality of first openings U1 and a plurality of second openings U2. The first openings U1 correspond to the positions of the color film elements 131, such that light rays emitted from the light emitting devices 11 may be emitted out by the corresponding first openings U1 after passing through the color film elements 131, so as to achieve a picture display function. The second openings U2 correspond to positions between the adjacent color film elements 131, that is, the second openings U2 are located in a pixel non-opening region of the display panel. In the embodiment of the disclosure, since the second openings U2 are used as imaging pinholes to achieve fingerprint identification based on a pinhole imaging principle, a size of an aperture of the second openings U2 is small, specifically, the size of the aperture of the second openings U2 ranges from 6 μm to 8 μm. Furthermore, one second opening U2 may be provided every 8 to 10 pixels, and a distance between adjacent second openings U2 is large, such that a total area of the openings in the light-shielding layer 14 is small, so as to reduce the reflectivity of the display panel. Specifically, the plurality of second openings U2 in the light-shielding layer 14 may be arranged in a matrix mode, or may be arranged in another mode, which is not limited herein.

Figure 2:
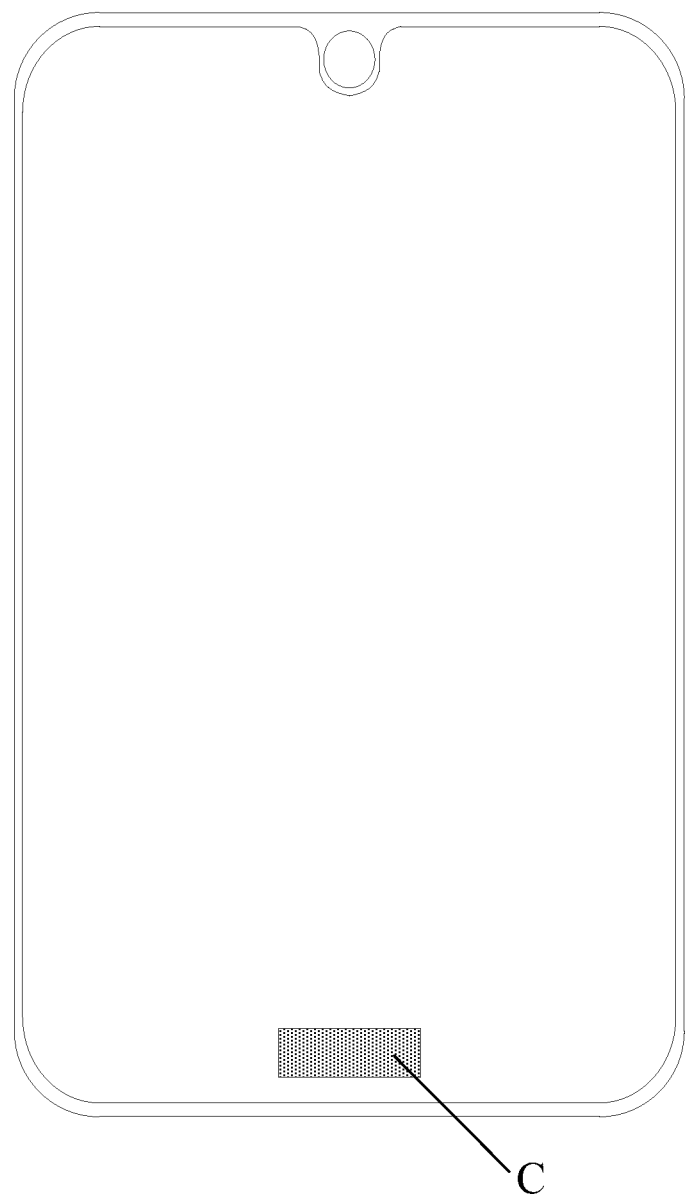
FIG. 2 is a structural schematic diagram of a top view of a display panel provided in an embodiment of the disclosure.

Specifically, the photosensitive sensor 16 may be on a side of the substrate 10 away from the light emitting devices 11, the photosensitive sensor is arranged on the whole surface, and the photosensitive sensor may be attached to a lower portion of the substrate 10 by an optically clear adhesive (OCA), such that the photosensitive sensor 16 does not influence normal display of the display panel. Specifically, the photosensitive sensor 16 may include a plurality of photosensitive elements and a control circuit. The photosensitive elements may be photosensitive diodes (PIN), and the control circuit may include a plurality of thin film transistors, signal lines, etc. In a practical application process, the plurality of photosensitive elements and the control circuit may be made on a silicon-based substrate, and then the photosensitive sensor obtained may be attached to a side of the substrate away from the light emitting devices. Specifically, a size of the photosensitive sensor may be set between 1 cm×1 cm and 4 cm×4 cm in order to be able to detect an entire fingerprint of the finger. FIG. 2 is a structural schematic diagram of a top view of the display panel. As shown in FIG. 2, the photosensitive sensor may be arranged at a position corresponding to a fingerprint identification region C. In the figure, the fingerprint identification region C is illustratively arranged at a lower position of a screen. During specific implementation, the fingerprint identification region C may be arranged at other positions, which is not limited herein.

During specific implementation, light rays emitted from the light emitting devices 11 around the second openings U2 is transmitted to the finger F and then is reflected by the finger F to obtain reflected light a, the reflected light a passes through the second openings U2 and then is transmitted to the photosensitive sensor 16, and the photosensitive sensor 16 may receive images of the plurality of second openings U2, such that the images received by the photosensitive sensor 16 are circular patterns arranged in a matrix mode, and the circular patterns are combined into one image by means of image processing, so as to obtain a fingerprint image of the finger.

Further, in the display panel provided in the embodiment of the disclosure, as shown in FIG. 1, the second openings U2 each is filled with a filter element 132. The filter element 132 may filter out part of light and may filter out part of light reflected by the reflected light a of the finger F, so as to further reduce reflectivity of the screen. For example, transmittance of the filter element 132 is about 50%, reflectivity of a second electrode 112 in each light emitting device 11 is 50% or so. When no filter element 132 is arranged, the reflectivity of the reflected light a transmitted to the second electrode 112 is 50%. After the filter element 132 is arranged, the reflected light a passes through the filter element 132, and then passes through the filter element 132 again after being reflected by the second electrode 112, such that the reflectivity may be reduced by 25%, and the reflectivity of the display panel is greatly reduced.

During specific implementation, in the display panel provided in the embodiment of the disclosure, as shown in FIG. 1, the color film layer includes color film elements of at least three colors, and color film elements of the different colors may transmit light of different colors, for example, the color film layer may include a red color film element, a green color film element and a blue color film element.

A material of the filter element 132 is the same as that of at least one color of the color film element 131. Specifically, the material of the filter element 132 may be a photosensitive resin material containing a pigment. The color film elements 131 have a strong light absorption effect, for example, the color film element 131 is a red color film element, after white light passes through the color film element, the color film element only transmits red light, and light of other colors is filtered out, such that the color film layer may play the same role as a filter element, the material of the filter element 132 may be set to be the same as the material of the at least one color film element 131 of at least one color. In the manufacturing process, the filter element 132 and the color film element 131 may be manufactured by the same patterning process, so as to reduce process steps, and to save the manufacturing cost. In practical application, the material of the filter element 132 may be different from that of the color film element 131, for example, the material of the filter element 132 may be a photosensitive resin material containing a pigment with a color different from the color of the color film element, or may be other filter materials, which is not limited herein.

In practical application, in the display panel provided in the embodiment of the disclosure, the color of the light which may be transmitted by the filter element 132 is the color of the light which may be responded by the photosensitive sensor 16, such that the situation that the light, which is transmitted to the photosensitive sensor 16 after the reflected light a passes through the filter element 132, may not be responded by the photosensitive sensor 16 is avoided, and the fingerprint identification effect is guaranteed. Specifically, the plurality of color film elements include a green color film element which may transmits green light. The material of the filter element is the same as the material of the green color film element, for example, the filter element may be made of a photosensitive resin material containing a green pigment. The color of the light which the photosensitive sensor 16 best responds to is green, and the material of the filter element 132 is set to be the same as the green color film element in color, such that the color of the light which may be transmitted by the filter element 132 is green, and the detection effect of the photosensitive sensor 16 is better. In addition, the filter element 132 may also be configured to transmit another color of light according to the photosensitive performance of the photosensitive sensor 16, which is not limited herein.

Specifically, in the display panel provided in the embodiment of the disclosure, as shown in FIG. 1, the light emitting device 11 may include a first electrode 111, a second electrode 112 on a side of the first electrode 111 away from the substrate 10, and a light emitting layer 113 between the first electrode 111 and the second electrode 112, that is, the light emitting device 11 may be an organic light-emitting device. Specifically, the first electrode 111 may be an anode, and the second electrodes 112 may be a cathode; alternatively, the first electrode 111 may be a cathode, and the second electrode 112 may be an anode, which is not limited herein. In the embodiments of the disclosure, the first electrode 111 is illustratively described as the anode and the second electrode 112 is illustratively described as the cathode. Specifically, the first electrode 111 may be made of a transparent conductive material, for example, indium tin oxide (ITO), etc., and the first electrode 111 may further include a metal reflecting layer. The second electrode 112 is a semitransparent metal film layer and may be made of magnesium, silver or a magnesium-silver alloy, etc. The above light emitting layer 113 may include an organic light-emitting layer and an organic functional layer, where the organic functional layer may include film layers such as a hole injection layer, a hole transport layer, a light emitting layer, an electron transport layer, an electron injection layer, etc. In FIG. 1, the light emitting layer 113 is illustratively arranged as a whole surface, or the light emitting layer 113 may also be arranged only in the first opening U1, which is not limited herein.

Similarly, with reference to FIG. 1, the display panel may further include a light blocking layer between the substrate 10 and the light emitting layer 113.

The light blocking layer includes a plurality of third openings U3, and orthographic projections of the third openings U3 on the substrate 10 have an overlapping region with orthographic projections of the second openings U2 on the substrate 10, for example, the plurality of third openings U3 may be arranged to correspond to the second openings U2 respectively.

In practical application, part of light emitted by the light emitting devices 11 may pass through the color film element 131 to be emitted, the other part of light is reflected by the film layer to return to the interior of the display panel to form interference light, for example, light b in FIG. 1, and the light b is continuously transmitted and finally transmitted to the photosensitive sensor 16 to influence the fingerprint identification effect. In the embodiment of the disclosure, by arranging the light blocking layer, the light b and other interference light may be filtered out, such that the influence of the interference light on fingerprint identification is avoided, noise of detection is reduced, and a signal-to-noise ratio of fingerprint identification is improved. In addition, a plurality of third openings U3 corresponding to the second openings U2 respectively are provided in the light blocking layer, so as to guarantee that the reflected light a may pass through the light blocking layer to be transmitted toward the photosensitive sensor 16.

During specific implementation, in the display panel provided in the embodiment of the disclosure, as shown in FIG. 1, the display panel may further include a pixel defining layer 15.

The pixel defining layer 15 is configured to define a region of each light emitting device.

The pixel defining layer 15 includes an opaque material, and the pixel defining layer 15 is multiplexed as the light blocking layer.

The pixel defining layer 15 may further includes a plurality of fourth openings U4, and orthographic projections of the fourth openings U4 on the substrate 10 have an overlapping region with orthographic projections of the first electrodes 111 on the substrate 10, for example, the plurality of fourth openings U4 may be arranged to correspond to the first electrodes 111 respectively.

During specific implementation, the pixel defining layer 15 may be made of an opaque material. Specifically, the pixel defining layer 15 may be made of black photosensitive organic matter, for example, the pixel defining layer 15 may be made of a black polyimide material, or the pixel defining layer 15 may also be made of a black photoresist material. Moreover, the pixel defining layer 15 may also be made of other opaque materials, which is not limited herein. The pixel defining layer 15 is made of an opaque material, such that the pixel defining layer may serve as a light blocking layer to absorb the interference light. Moreover, using the pixel defining layer as the light blocking layer does not increase process steps and process cost, the manufacturing process is simple, and mass production is easy to achieve. In an actual process, the pixel defining layer may be manufactured by means of exposure, development and other processes, the manufacturing process is simple, and the manufacturing cost is low. Furthermore, fourth openings U4 corresponding to the first electrodes 111 respectively are provided in the pixel defining layer, and the fourth openings U4 may expose the corresponding first electrodes 111, so as to guarantee electrical connection between the first electrodes 111 and the light emitting layers 113. Specifically, the thickness of the pixel defining layer 15 may be set to be about 1 μm.

It should be noted that in the embodiment of the disclosure, positions of the film layers are determined by a manufacturing sequence of the film layers. In the manufacturing process, the pixel defining layer 15 is firstly manufactured and then the light emitting layer 113 is manufactured, such that the light emitting layer 112 is on a side of the pixel defining layer 15 away from the substrate 10. That is, the light emitting layer 112 is arranged as a whole layer, or the light emitting layer 112 is only provided with patterns in the fourth openings U4 in the pixel defining layer 15, and the light emitting layer 112 is positioned on a side of the pixel defining layer 15 away from the substrate 10, such that the pixel defining layer 15 may be multiplexed as the light blocking layer by using an opaque material to manufacture the pixel defining layer 15.

In addition, the display panel may further include a driving film layer 20, the driving film layer 20 may include a first conductive layer 201, a second conductive layer 202, a third conductive layer 203, etc. Specifically, the first conductive layer 201 is between the substrate 10 and the light emitting device 11, the second conductive layer 202 is between the substrate 10 and the first conductive layer 201, and the third conductive layer 203 is between the first conductive layer 201 and the second conductive layer 202. The first conductive layer 201 may include structures, for example, a data signal line. The second conductive layer 202 is on a side of the first conductive layer 201 close to the substrate 10, and the second conductive layer 202 may include structures, for example, a gate electrode and a first electrode of a storage capacitor. The third conductive layer 203 is between the first conductive layer 201 and the second conductive layer 202, and the third conductive layer 203 may include a structure, for example, a second electrode of the storage capacitor. In addition, the driving film layer 20 may further include other film layers, which are not repeated herein. During specific implementation, since the first conductive layer 201 is a metal film layer, the first conductive layer 201 may be used as a light blocking layer, or another light absorbing film layer may also be used as the light blocking layer, which is not limited herein.

Specifically, the first conductive layer 201 includes a plurality of fifth openings U5, and orthographic projections of the fifth openings U5 on the substrate 10 have an overlapping region with orthographic projections of the second openings U2 on the substrate 10, for example, the plurality of fifth openings U5 may be arranged to correspond to the second openings U2 respectively.

An orthographic projection of a pattern of the second conductive layer 202 on the substrate 10 does not overlap the orthographic projections of the second openings U2 on the substrate 10.

An orthographic projection of a pattern of the third conductive layer 203 on the substrate 10 does not overlap the orthographic projections of the second openings U2 on the substrate 10.

During specific implementation, the first conductive layer 201, the second conductive layer 202 and the third conductive layer 203 may be made of metal, such that the first conductive layer 201, the second conductive layer 202 and the third conductive layer 203 are opaque. In order to avoid influencing the reflected light a transmitted to the photosensitive sensor 16 and avoid influencing the fingerprint identification effect, the fifth openings U5 are provided in the first conductive layer 201, and a pattern of the second conductive layer 202 and a pattern of the third conductive layer 203 are avoided to cover the second openings U2, so as to guarantee the reflected light a to be smoothly transmitted to the photosensitive sensor 16. Moreover, under the condition that the display panel includes other opaque film layers, it is necessary to avoid to cover the positions of the second openings U2, so as to guarantee the fingerprint identification effect.

In practical application, in the display panel provided in the embodiment of the disclosure, as shown in FIG. 1, the display panel may further include a thin film transistor TFT.

The first conductive layer 201 may include a conductive connection portion LB.

An input end S of the thin film transistor TFT is electrically connected to the first electrode 111 by means of the conductive connection portion LB.

In practical application, a driving signal may be provided to the first electrodes 111 by means of the thin film transistor TFT to control light emission of the light emitting device 11. In addition, other thin film transistors and signal lines may also be included in the driving film layer 20, which is not repeated herein.

In addition, the display panel provided in the embodiment of the disclosure may further have a touch function. Specifically, the display panel provided in the embodiment of the disclosure may further include a touch detection layer 17 between the encapsulation layer 12 and the color film layer, the touch detection layer 17 may include a plurality of self-capacitance electrodes which are independent of one another, to detect a touch position by using a self-capacitance principle, or the touch detection layer 17 may further include a plurality of first capacitance electrodes and a plurality of second capacitance electrodes, to detect a touch position by using a mutual capacitance principle, and a specific detection method is not limited herein. During specific implementation, the touch detection layer 17 may be made of a transparent conductive material, or the touch detection layer 17 is arranged to be of a metal grid structure, such that the situation that emitting the reflected light a of the finger to the photosensitive sensor 16 is influenced is prevented. In addition, under the condition that the touch detection layer 17 includes an opaque metal electrode, a position of the metal electrode needs to avoid the positions of the second openings U2, so as to prevent the fingerprint identification effect from being influenced.

During specific implementation, in the display panel provided in the embodiment of the disclosure, as shown in FIG. 1, a size of an aperture of the third opening U3 is smaller than that of the second opening U2, and the reflected light a reflected by the finger F is converged at the positions of the third openings U3, such that setting the size of the aperture of the third opening U3 to be smaller than that of the second opening U2 can make the reflected light a smoothly pass through. Specifically, the size of the aperture of the third opening U3 may range from 5 μm to 6 μm, the size of the aperture of the second opening U2 may range from 6 μm to 8 μm. Further, openings corresponding to the third openings U3 are provided in a metal film layer (for example, the first conductive layer 201) of the pixel defining layer 15 close to the substrate 10, a size of an aperture of the opening in the metal film layer may be larger than that of the third opening U3, so as to adapt to a divergence degree of the reflected light a, and the reflected light a may smoothly pass to be transmitted to the photosensitive sensor 16, such that the accuracy of fingerprint identification is high.

Figure 3:
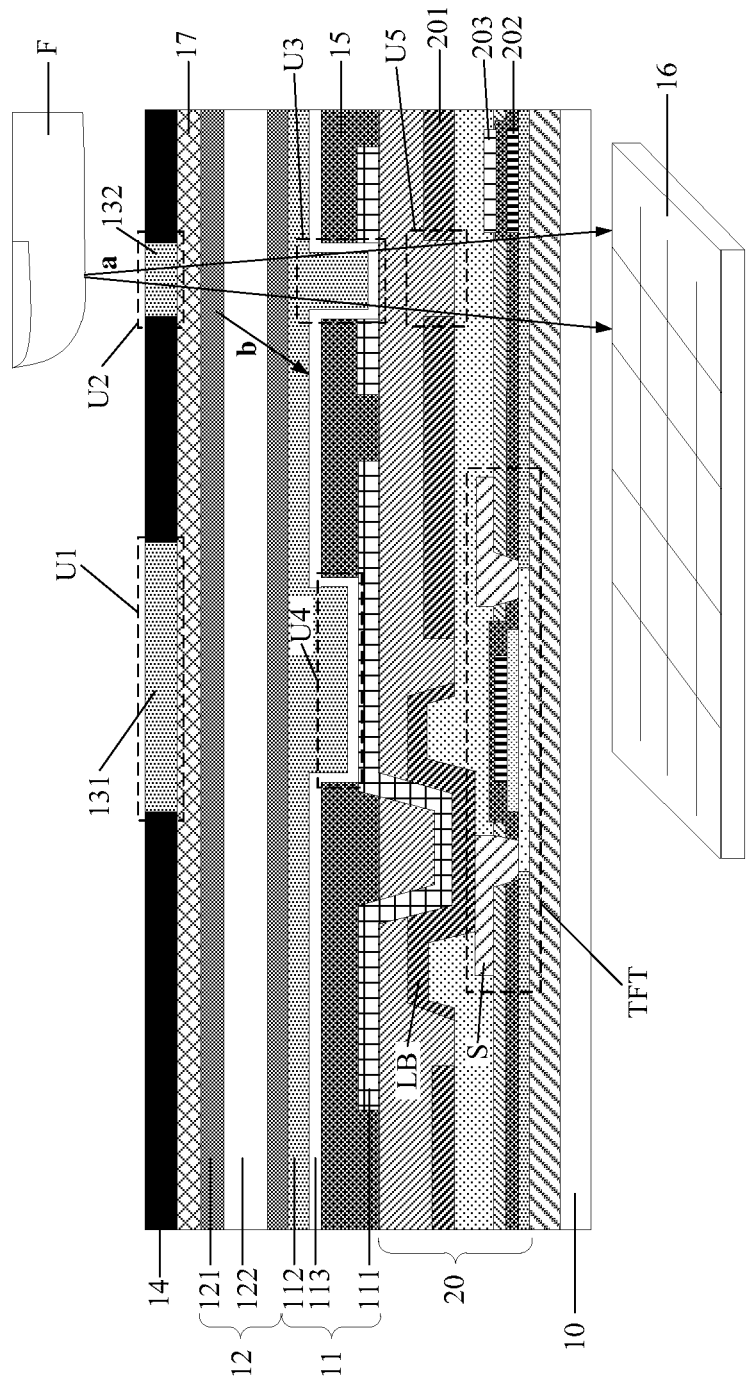
FIG. 3 is a second schematic diagram of a sectional structure of a display panel provided in an embodiment of the disclosure.

Furthermore, as shown in FIG. 3, the reflected light a of the finger F may also converge at the positions of the second openings U2, thus, in a direction of the light-shielding layer 14 pointing towards the substrate 10, a size of an aperture of the imaging pinholes gradually increases, for example, the size of the aperture of the third opening U3 is larger than that of the second opening U2. Specifically, the size of the aperture of the second opening U2 may range from 6 μm to 8 μm, the size of the aperture of the third opening U3 may range from 8 μm to 10 μm, and the size of the aperture of the corresponding opening in the metal film layer (for example, the first conductive layer 201) is larger than that of the third opening U3 to adapt to the divergence degree of the reflected light a, and the reflected light a may smoothly pass through and be transmitted toward the photosensitive sensor 16, such that the accuracy of fingerprint identification is high.

In the embodiment of the disclosure, the reflected light a of the finger F illustratively converges at the second openings U2 or the third openings U3, and during specific implementation, the reflected light a may also converge at other positions and may be determined according to a thickness of each film layer in the display panel and a required imaging view angle. The size of the aperture of the imaging pinholes in each film layer may be determined according to a converging position of the reflected light a, an objective-image relation of pinhole imaging, the thickness of each film layer of the display panel, a pixel density of the display panel and other factors, which is not limited herein.

Specifically, in the display panel provided in the embodiment of the disclosure, the orthographic projections of the plurality of second openings U2 on the substrate 10 are located within the orthographic projections of the photosensitive sensor 16 on the substrate 10, such that the reflected light of the finger F may pass through the second openings U2 to be transmitted to the photosensitive sensor 16 so as to achieve fingerprint identification. During specific implementation, the size of the photosensitive sensor 16 may also be set to be greater than the area where all second openings U2 are located so as to guarantee that the finger reflected light passing through the second openings U2 may be transmitted to the photosensitive sensor 16.

Based on the same inventive concept, an embodiment of the disclosure further provides a display device, including the above display panel. The display device may be used in any product or part with a display function, for example, a mobile phone, a tablet personal computer, a television, a display, a notebook computer, a digital photo frame, a navigator, etc. The problem solving principle of the display device is similar to that of the display panel, such that the implementation of the display device may be referred to the implementation of the display panel above, which is not repeated herein.

Based on the same inventive concept, an embodiment of the disclosure further provides a manufacturing method for the above display panel. The problem solving principle of the manufacturing method is similar to that of the display panel, such that the implementation of the manufacturing method may be referred to the implementation of the display panel above, which is not repeated herein.

Figure 4:
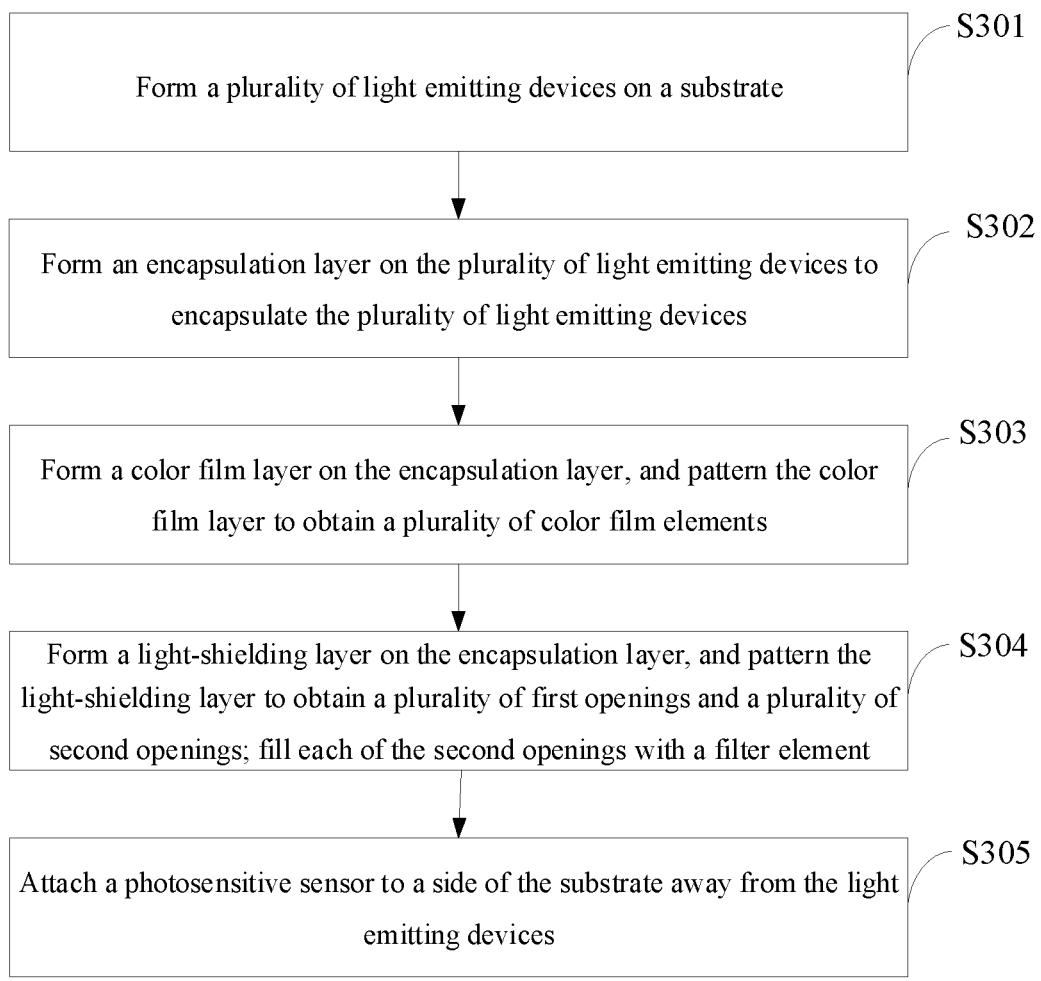
FIG. 4 is a schematic flowchart of a manufacturing method for a display panel provided in an embodiment of the disclosure.

A manufacturing method for a display panel provided in an embodiment of the disclosure is shown in FIG. 4. The manufacturing method includes the following.

S301, a plurality of light emitting devices are formed on a substrate.

S302, an encapsulation layer is formed on the plurality of light emitting devices to encapsulate the plurality of light emitting devices.

S303, a color film layer is formed on the encapsulation layer, and a plurality of color film elements is obtained by patterning the color film layer.

S304, a light-shielding layer is formed on the encapsulation layer, and a plurality of first openings and a plurality of second openings are obtained by patterning the light-shielding layer; and each second opening is filled with a filter element.

S305, a manufactured photosensitive sensor is attached to a side of the substrate away from the light emitting devices.

In the manufacturing method provided in the embodiment of the disclosure, a plurality of second openings are obtained by patterning the light-shielding layer, the second openings may be used as imaging pinholes for fingerprint identification, then the light reflected by the finger is transmitted to the photosensitive sensor, and the light reflected by the finger is imaged at the position of the photosensitive sensor, so as to achieve a fingerprint identification function; and the second openings serving as imaging pinholes are provided in the light-shielding layer, fingerprint identification is achieved in a pinhole imaging mode, and dense holes do not need to be arranged, such that a total area of the holes is reduced, and the reflectivity of the display panel is reduced.

During specific implementation, with reference to FIG. 1, before S301, the method may further include the following. Film layers of the driving film layer 20 are formed on the substrate 10, for example, the first conductive layer 201, the second conductive layer 202, the third conductive layer 203, insulating layers, etc. are formed. S301 may include: forming a first electrode 111, a light emitting layer 113, and a second electrode 112.

S302 may include: sequentially forming an inorganic film layer 121 and an organic film layer 122 that are stacked with each other.

In S303, a photosensitive resin material containing a pigment may be used for manufacturing the color film layer. Specifically, the photosensitive resin material containing the pigment may be coated on the encapsulation layer and then is subject to exposure, development and other processes to obtain the color film elements of one color. Exposure, development and other processes are performed repeatedly to obtain the color film elements 131 of at least three colors. During specific implementation, the color film elements may also be made of other photosensitive organic matter, for example, the color film elements may be made of polyimide materials, which is not limited herein.

During specific implementation, S304 may be executed before S303, or S304 may be executed after S304. Moreover, when S304 is executed before S303, the second openings may be filled with a filter material by using the same process as the at least one color film element of at least one color, so as to save one time of patterning process, and the manufacturing cost is lower.

In S305, a plurality of photosensitive elements and a control circuit may be manufactured on a silicon-based substrate to form a photosensitive sensor, and then the obtained photosensitive sensor is attached to a side of the substrate away from the light emitting devices. S305 may be executed before S301, or S305 may be executed after S304, or S305 may also be executed among S301 to S304, which is not limited herein. In addition, a photosensitive sensor may also be formed on the substrate before S301 to integrate the photosensitive sensor inside the display panel.

According to the display panel, a manufacturing method therefor, and a display device provided in the embodiments of the disclosure, a plurality of second openings are provided in the light-shielding layer, the second openings may be used as imaging pinholes for fingerprint identification, then the light reflected by the finger is transmitted to the photosensitive sensor, and the light reflected by the finger is imaged at the position of the photosensitive sensor, so as to achieve a fingerprint identification function; and the second openings serving as imaging pinholes are provided in the light-shielding layer, fingerprint identification is achieved in a pinhole imaging mode, and dense holes do not need to be arranged, such that a total area of the holes is reduced, and the reflectivity of the display panel is reduced.

It should be apparent to those skilled in the art that various modifications and variations can be made to the disclosure without departing from the spirit and scope of the disclosure. Thus, it is intended that the disclosure cover such modifications and variations which come within the scope of the appended claims and their equivalents, as well.

What is claimed is:
1. A display panel, comprising:
a substrate;
a plurality of light emitting devices on the substrate;
an encapsulation layer on a side of the light emitting devices away from the substrate, configured for encapsulating the plurality of light emitting devices;
a photosensitive sensor on a side of the light emitting devices away from the encapsulation layer;
a color film layer on a side of the encapsulation layer away from the substrate, comprising a plurality of color film elements, wherein orthographic projections of the color film elements on the substrate are provided with an overlapping region with orthographic projections of the light emitting devices on the substrate; and
a light-shielding layer on a side of the encapsulation layer away from the substrate, comprising a plurality of first openings and a plurality of second openings, wherein orthographic projections of the first openings on the substrate are provided with an overlapping region with the orthographic projections of the color film elements on the substrate, the second openings each are filled with a filter element, and the second openings each are used for transmitting light reflected by a finger to the photosensitive sensor, such that the light reflected by the finger is imaged at the position of the photosensitive sensor;

wherein the color film layer comprises color film elements of at least three colors; and the color film elements of different colors transmits light rays of different colors, and a material of the filter element is the same as a material of at least one color film element of at least one color.

2. The display panel according to claim 1, wherein the plurality of color film elements comprise a green color film element transmitting a green light ray; and a material of the filter element is the same as a material of the green color film element.

3. The display panel according to claim 2, wherein orthographic projections of the plurality of second openings on the substrate are in an orthographic projection of the photosensitive sensor on the substrate.

4. The display panel according to claim 1, wherein the photosensitive sensor is on a side of the substrate away from the light emitting devices.

5. The display panel according to claim 1, wherein each of the light emitting devices comprises: a first electrode, a second electrode on a side of the first electrode away from the substrate, and a light emitting layer between the first electrode and the second electrode;

the display panel further comprises a light blocking layer between the substrate and the light emitting layer; and the light blocking layer comprises a plurality of third openings, and orthographic projections of the third openings on the substrate are provided with an overlapping region with orthographic projections of the second openings on the substrate.

6. The display panel according to claim 5, further comprising:

a pixel defining layer;

wherein the pixel defining layer is configured to define a region of the light emitting device;

the pixel defining layer comprises an opaque material, and the pixel defining layer is multiplexed as the light blocking layer; and the pixel defining layer further comprises a plurality of fourth openings, and orthographic projections of the fourth openings on the substrate are provided with an overlapping region with orthographic projections of the first electrodes on the substrate.

7. The display panel according to claim 6, wherein the pixel defining layer is made of black photosensitive organic matter.

8. The display panel according to claim 6, wherein a size of an aperture of each of the third openings is smaller than a size of an aperture of each of the second openings.

9. The display panel according to claim 5, further comprising:

a first conductive layer between the substrate and the light emitting devices;

a second conductive layer between the substrate and the first conductive layer; and a third conductive layer between the first conductive layer and the second conductive layer;

wherein the first conductive layer comprises a plurality of fifth openings, and orthographic projections of the fifth openings on the substrate are provided with an overlapping region with the orthographic projections of the second openings on the substrate;

an orthographic projection of a pattern of the second conductive layer on the substrate does not overlap the orthographic projections of the second openings on the substrate; and an orthographic projection of a pattern of the third conductive layer on the substrate does not overlap the orthographic projections of the second openings on the substrate.

10. The display panel according to claim 9, further comprising:

a thin film transistor;

wherein the first conductive layer comprises a conductive connection portion; and an input end of the thin film transistor is electrically connected to the first electrode through the conductive connection portion.

11. The display panel according to claim 10, wherein a size of an aperture of each of the third openings is smaller than a size of an aperture of each of the second openings.

12. The display panel according to claim 9, further comprising: a touch detection layer between the encapsulation layer and the color film layer.

13. The display panel according to claim 9, wherein a size of an aperture of each of the third openings is smaller than a size of an aperture of each of the second openings.

14. The display panel according to claim 5, wherein a size of an aperture of each of the third openings is smaller than a size of an aperture of each of the second openings.

15. The display panel according to claim 14, wherein the size of the aperture of each of the third openings ranges from 5 μm to 6 μm, and the size of the aperture of each of the second openings ranges from 6 μm to 8 μm.

16. The display panel according to claim 1, wherein orthographic projections of the plurality of second openings on the substrate are in an orthographic projection of the photosensitive sensor on the substrate.

17. A display device, comprising the display panel according to claim 1.

18. A manufacturing method for the display panel according to claim 1, comprising:

forming the plurality of light emitting devices on the substrate;

forming the encapsulation layer on the plurality of light emitting devices to encapsulate the plurality of light emitting devices;

forming the color film layer on the encapsulation layer, and patterning the color film layer to obtain the plurality of color film elements;

forming the light-shielding layer on the encapsulation layer, and patterning the light-shielding layer to obtain the plurality of first openings and the plurality of second openings;

filling each of the second openings with a filter element; and attaching the photosensitive sensor to a side of the substrate away from the light emitting devices.

* * * * *